(12) United States Patent
Kamoshida

(10) Patent No.: US 7,061,310 B2
(45) Date of Patent: Jun. 13, 2006

(54) ALL-PASS FILTER CIRCUIT

(75) Inventor: Iwao Kamoshida, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 10/932,241

(22) Filed: Sep. 2, 2004

(65) Prior Publication Data
US 2005/0099225 A1 May 12, 2005

(30) Foreign Application Priority Data
Sep. 4, 2003 (JP) ............................. 2003-312749

(51) Int. Cl.
*H03K 5/00* (2006.01)
(52) U.S. Cl. ...................................... 327/557; 327/552
(58) Field of Classification Search ......... 327/552–559
See application file for complete search history.

(56) References Cited
U.S. PATENT DOCUMENTS
3,633,122 A * 1/1972 Braga ........................... 330/69
4,518,878 A * 5/1985 Moulding .................... 327/231
5,258,716 A * 11/1993 Kondo et al. ................. 330/85
6,194,959 B1 2/2001 Kamoshida et al.

FOREIGN PATENT DOCUMENTS
JP 2000-261289 9/2000

OTHER PUBLICATIONS
Klaas Bult, et al., "A CMOS Analog Continuous-Time Delay Line with Adaptive Delay-Time Control", IEEE.J Solid-State Circuits, vol. SC-23, No. 3, 8 Pages, June 1988.

* cited by examiner

*Primary Examiner*—Dinh T. Le
(74) *Attorney, Agent, or Firm*—Oblon, Spivak, McClelland, Maier & Neustadt, P.C.

(57) ABSTRACT

An all-pass filter circuit includes a first terminal to which an input signal is input, a capacitor having a first electrode connected to the first terminal and a second electrode, a current amplifier circuit which is configured by MOS transistors, has an input terminal connected to the second electrode and supplied with a first signal output from the capacitor, and outputs a second signal based on conductance thereof, a second terminal to which a control signal for controlling the conductance is input, and an adder circuit which is configured by MOS transistors and adds the second signal and input signal together to output a third signal.

16 Claims, 2 Drawing Sheets

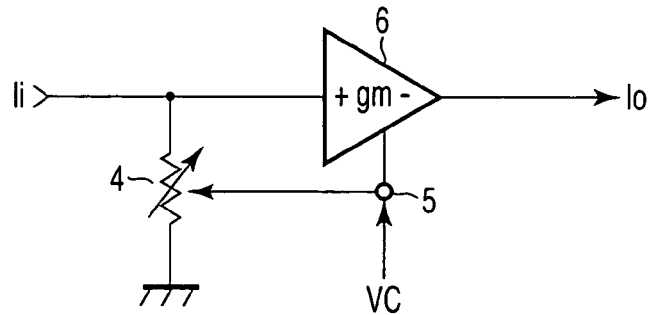
F I G. 3
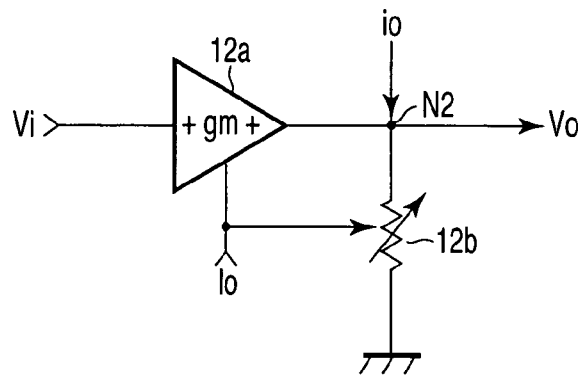
F I G. 4
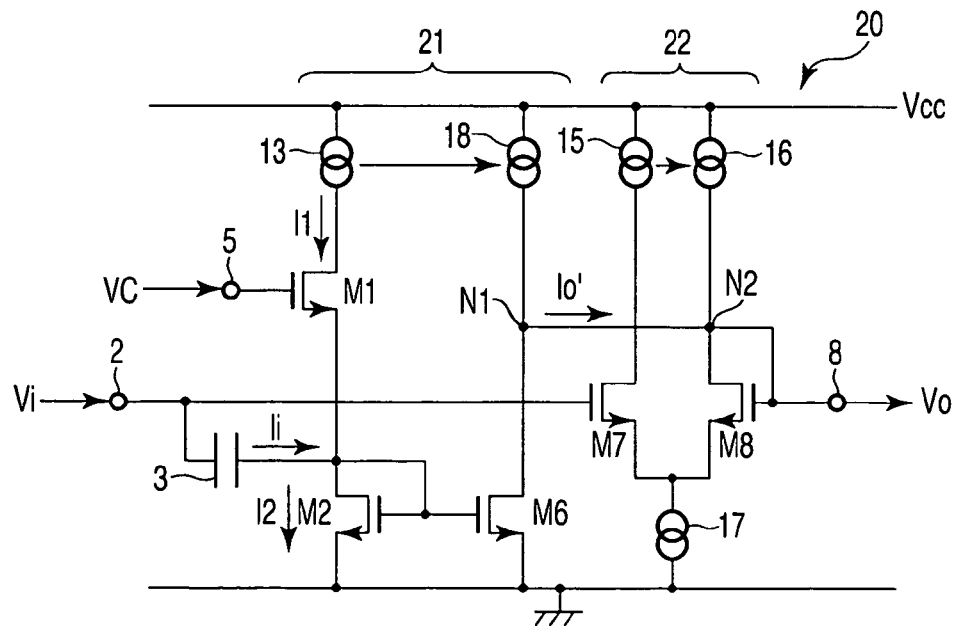
F I G. 5

ALL-PASS FILTER CIRCUIT

CROSS-REFERENCE TO RELATED APPLICATIONS

This application is based upon and claims the benefit of priority from prior Japanese Patent Application No. 2003-312749, filed Sep. 4, 2003, the entire contents of which are incorporated herein by reference.

BACKGROUND OF THE INVENTION

1. Field of the Invention

This invention relates to a filter circuit and more particularly to an all-pass filter circuit which controls group delay.

2. Description of the Related Art

In recent years, a requirement for the high performance of filters became stronger. Problems occurring at this time are associated with the power consumption and circuit integration density. However, if the power consumption is lowered and the integration density is enhanced, degradation in the characteristic of the filter, for example, degradation in the noise performance becomes a problem.

The transfer function of a linear all-pass filter can be expressed by the following equations (1) and (2). The equation (1) indicates the transfer function $H_1(s)$ attained when the all-pass filter is configured by use of a low-pass filter (which is hereinafter referred to as an LPF). The equation (2) indicates the transfer function $H_2(s)$ attained when the all-pass filter is configured by use of a high-pass filter (which is hereinafter referred to as an HPF). In this case, "s" indicates "jω" and "j" is an imaginary unit.

$$H_1(s) = 1 - 2LPF(s) = 1 - \frac{2\omega_0}{s+\omega_0} = \frac{s-\omega_0}{s+\omega_0} \quad (1)$$

$$H_2(s) = 2HPF(s) - 1 = \frac{2s}{s+\omega_0} - 1 = \frac{s-\omega_0}{s+\omega_0} \quad (2)$$

LPF(s) in the equation (1) and HPF(s) in the equation (2) respectively indicate transfer functions of the low-pass filter LPF and high-pass filter HPF.

Further, $\omega_0$ is expressed by the following equation.

$$\omega_0 = \frac{1}{CR} \quad (3)$$

where C indicates a capacitance value and R indicates a resistance value. Further, the group delay amount τ caused by the transfer functions of the equations (1) and (2) is expressed by the following equation.

$$\tau = \frac{2}{CR} \quad (4)$$

In the all-pass filter having the transfer function indicated in the equation (1) or (2), the group delay amount in the band can be controlled by controlling $\omega_0$. Therefore, in the case of the all-pass filter contained in an IC (Integrated Circuit), the group delay amount τ can be controlled by controlling $\omega_0$ by use of a variable resistor.

For example, the all-pass filter contained in the IC is configured by using a gilbert circuit as a current amplifier (gm amplifier). The gilbert circuit is used as a variable gm amplifier by supplying a control signal to the gilbert circuit. Alternatively, a circuit using a MOS linear circuit is used as the variable resistor to configure the all-pass filter. In order to keep the in-band group delay constant irrespective of the frequency, circuits having preset group delay amounts are cascade-connected in the all-pass filter.

Further, as the related art described above, an all-pass filter which is suitably contained in the IC is disclosed (refer to KLAAS BULT et al., "A CMOS Analog Continuous-Time Delay Line with Adaptive Delay-time Control", IEEE J. Solid-State Circuits, vol. SC-23, no. 3, pp. 759–766, June 1988).

The gilbert circuit subjects an input signal to the expansion or compression process. Therefore, the noise characteristic of the all-pass filter is deteriorated. In order to solve the problem of the noise, it is unavoidable to increase a current to some extent. Further, when the all-pass filters are cascade-connected, the power consumption will increase.

In the circuit using the MOS linear circuit, a configuration using an OTA (Operational Trans-conductance Amplifier) can be considered. In this case, in order to compensate for the secondary distortion of the MOS transistor, it is necessary to convert an input in a differential fashion. As a result, the circuit scale increases.

Further, since a current inverter circuit is used in the above related art, it is necessary to voltage-current convert a signal which is input to the all-pass filter. Unlike a bipolar transistor, it is difficult to perform the voltage-current conversion without causing any distortion in the operation of the MOS transistor. However, in this case, if a BiCMOS process is used, it is possible to configure the above filter by using a voltage-current conversion circuit.

If the BiCMOS process is used, the chip cost will rise since the process cost is high in comparison with that for the MOS process. Further, if the MOS process is used, it is difficult to attain the configuration of the voltage-amplifier conversion circuit as described before and the circuit scale becomes relatively large even if the above circuit can be configured. Therefore, the chip area is inevitably increased and the chip cost will rise.

Further, in the above related art, in order to derive an output signal in the form of voltage, it is necessary to current-voltage convert the output signal of the filter. Therefore, the circuit configuration is attained by (voltage-current conversion circuit+all-pass filter+current-voltage conversion circuit). In this circuit, since two circuits including the voltage-current conversion circuit and current-voltage conversion circuit are required, the circuit scale increases.

Further, the control filter section is used for current transmission and the output impedance thereof is high. Therefore, it is subject to disturbance from the other circuits. Thus, in the case of multifunctional IC, it is necessary to pay much attention to the layout design and it becomes difficult to carryout the layout design.

BRIEF SUMMARY OF THE INVENTION

An all-pass filter circuit according to one aspect of the present invention comprises a first terminal to which an input signal is input, a capacitor having a first electrode connected to the first terminal and a second electrode, a current amplifier circuit which is configured by MOS transistors, has an input terminal connected to the second electrode and supplied with a first signal output from the capacitor, and outputs a second signal based on conductance thereof, a second terminal to which a control signal for controlling the conductance is input, and an adder circuit which is configured by MOS transistors and adds the second signal and input signal together to output a third signal.

BRIEF DESCRIPTION OF THE SEVERAL VIEWS OF THE DRAWING

FIG. 3 is a conceptual diagram of a current inverter circuit 11 shown in FIG. 2;

FIG. 4 is a conceptual diagram of a buffer circuit 12 shown in FIG. 2; and

FIG. 5 is a circuit diagram showing the configuration of an all-pass filter 20 according to a second embodiment of this invention.

DETAILED DESCRIPTION OF THE INVENTION

There will now be described embodiments of this invention with reference to the accompanying drawings. In the following explanation, common reference symbols are attached to elements having the same functions and configurations and repetitive explanation is made only when necessary.

First Embodiment

Figure 1:
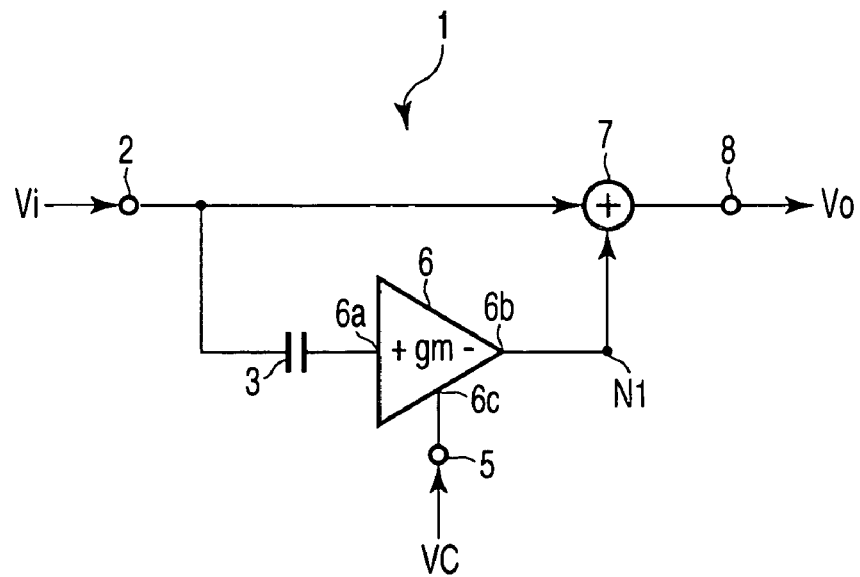
FIG. 1 is a conceptual diagram showing the configuration of an all-pass filter 1 according to a first embodiment of this invention.

FIG. 1 is a conceptual diagram showing the configuration of an all-pass filter (APF) 1 according to a first embodiment of this invention. The APF 1 is a linear filter. An input signal vi is input to the APF 1 from the exterior. The APF 1 controls the group delay of the input signal vi. The input signal vi is a voltage signal. In the following explanation, a small letter "v" denoting a signal indicates the signal component (a.c. component) of voltage. Further, a small letter "i" indicates the signal component of a current. A capital letter "I" expresses a current containing a d.c. component and a.c. component. That is, the current I contains the current i.

The APF 1 includes an input terminal 2, capacitor 3, control terminal 5, current amplifier circuit 6, adder circuit 7 and output terminal 8. An input signal vi is input to the input terminal 2.

The current amplifier circuit 6 is an inverting amplifier of single configuration (i.e., input and output are single). The current amplifier circuit 6 is configured by a circuit using MOS transistors. The current amplifier circuit 6 has an input terminal 6a, output terminal 6b and control terminal 6c. Control voltage VC which controls the mutual conductance gm1 of the current amplifier circuit 6 is input to the control terminal 6c via the control terminal 5.

One-side electrode of the capacitor 3 is connected to the input terminal 2. The other electrode of the capacitor 3 is connected to the input terminal 6a of the current amplifier circuit 6. The output terminal 6b of the current amplifier circuit 6 is connected to the adder circuit 7 via a node N1. Further, the input terminal 2 is connected to the adder circuit 7. The adder circuit 7 is configured by MOS transistors. The output of the adder circuit 7 is connected to the output terminal 8.

The operation of the APF 1 with the above configuration is explained below. An input signal vi is input to the current amplifier circuit 6 via the capacitor 3. The current amplifier circuit 6 inverts a signal output from the capacitor 3 based on the mutual conductance gm1. As described before, the conductance gm1 is controlled by the control voltage VC. The time constant of the input signal vi input to the capacitor 3 is set by the capacitance of the capacitor 3 and the input impedance of the current amplifier circuit 6.

The adder circuit 7 adds the input signal vi with a signal output from the current amplifier circuit 6. The thus added signal is output from the output terminal 8 as an output signal vo.

Figure 2:
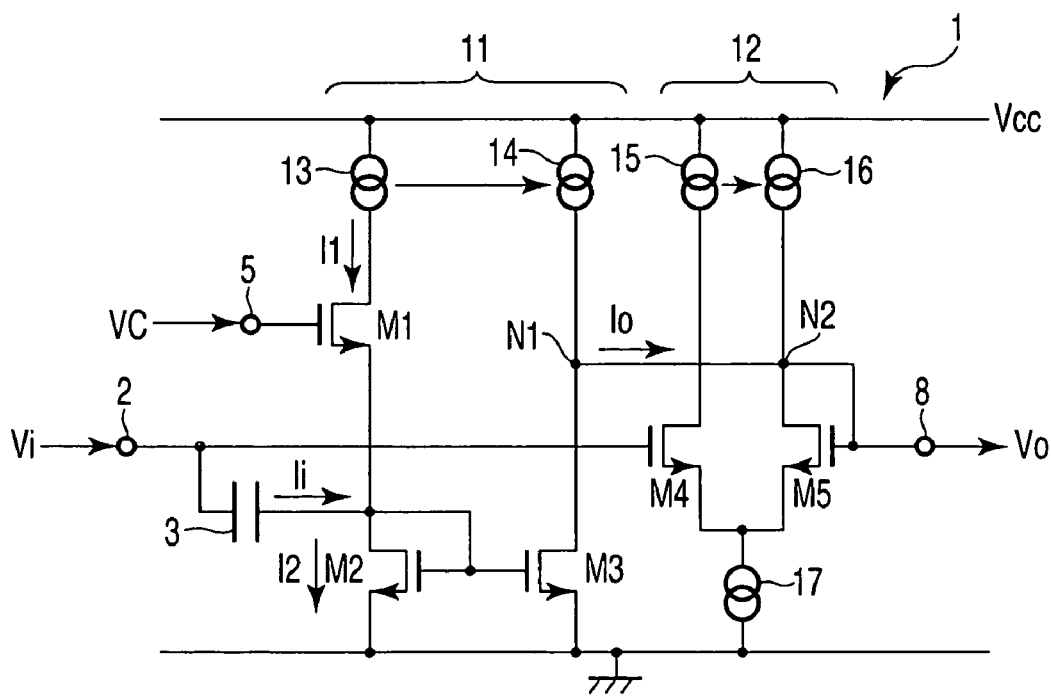
FIG. 2 is a circuit diagram showing the concrete example of the configuration of the APF 1 shown in FIG. 1.

FIG. 2 is a circuit diagram showing the concrete example of the configuration of the APF 1 shown in FIG. 1. The APF 1 is configured by the capacitor 3, current inverter circuit 11 and buffer circuit 12. The current inverter circuit 11 corresponds to the current amplifier circuit 6. The buffer circuit 12 corresponds to the adder circuit 7. The capacitor 3 and current inverter circuit 11 configure a high-pass filter HPF.

First, the current inverter circuit 11 is explained. The current inverter circuit 11 includes N-type MOS transistors M1, M2, M3 and current sources 13, 14. The transistors M1 and M2 have substantially the same ratio of W/L. In this case, "W" indicates the channel width and "L" indicates the channel length. Each of the current sources 13 and 14 is configured by a current mirror circuit using MOS transistors. The current sources 13 and 14 are connected to a power supply voltage node Vcc.

The gate of the transistor M1 is connected to the control terminal 5. The drain of the transistor M1 is connected to the current source 13. The source of the transistor M1 is connected to the drain of the transistor M2.

The transistors M2 and M3 configure a current mirror circuit. The drain of the transistor M2 is connected to the other electrode of the capacitor 3. Further, the drain and gate of the transistor M2 are connected together. The source of the transistor M2 is grounded.

The drain of the transistor M3 is connected to the current source 14 via the node N1. The gate of the transistor M3 is connected to the gate of the transistor M2. The source of the transistor M3 is grounded.

The current inverter circuit 11 inverts an input current Ii input from the capacitor 3 by use of the current mirror circuit configured by the transistors M2 and M3 and the current mirror circuit configured by the current sources 13 and 14 and then outputs an output current Io. The output current Io is output from the node N1.

The input impedance Zi of the current inverter circuit 11 is determined by the transistors M2 and M3. The input impedance Zi is explained below by use of the equations.

A current I2 flowing through the transistor M2 is expressed by the following equation.

$$I2 = Ii + I1 \quad (5)$$

The currents I1 and I2 are expressed by the following equations.

$$I1 = k(Vgs_1 - Vt)^2 \quad (6)$$

$$I2 = k(Vgs_2 - Vt)^2 \quad (7)$$

The control voltage VC is expressed by the following equation.

$$Vgs_2 + Vgs_1 = VC \quad (8)$$

where "k" is a constant which is proportional to the ratio of W/L of the MOS transistor. Further, $Vgs_1$, $Vgs_2$ indicate gate-source voltages of the MOS transistors M1 and M2.

Further, Vt indicates threshold voltage of the MOS transistor. The control voltage VC is gate control voltage of the transistor M3.

Ii is expressed by the following equation based on the equations (5), (6), (7).

$$Ii = k(Vgs_2 - Vgs_1)(Vgs_2 + Vgs_1 - 2Vt) \quad (9)$$

Therefore, Ii can be expressed as follows based on the equations (8), (9).

$$Ii = k(2Vgs_2 - VC)(VC - 2Vt) \quad (10)$$

Further, $Vgs_2$ can be expressed as follows based on the equation (10).

$$Vgs_2 = \frac{VC}{2} + \frac{Ii}{2k(VC - 2Vt)} \quad (11)$$

Thus, the input impedance Zi of the current inverter circuit 11 can be expressed by the following equation.

$$Zi = \frac{1}{2k(VC - 2Vt)} \quad (12)$$

It is clearly understood from the equation (12) that the input impedance Zi of the current inverter circuit 11 can be controlled by the control voltage VC. FIG. 3 is a conceptual diagram of the current inverter circuit 11. The input impedance Zi of the current inverter circuit 11 can be replaced by the resistance R of a variable resistor circuit 4. At this time, the mutual conductance gm1 of the current amplifier circuit 6 becomes "−1/R". The resistance R can be varied by use of the control voltage VC.

Next, the buffer circuit 12 is explained. The buffer circuit 12 includes N-type MOS transistors M4, MS and current sources 15, 16, 17. The transistors M4 and MS have substantially the same ratio of W/L. Each of the current sources 15, 16 is configured by a current mirror circuit using MOS transistors. The current sources 15, 16 are connected to the power supply voltage node Vcc.

The gate of the transistor M4 is connected to the input terminal 2. The drain of the transistor M4 is connected to the current source 15. The source of the transistor M4 is connected to the current source 17. The drain of the transistor MS is connected to the current source 16 via a node N2. The drain and gate of the transistor MS are connected together. The gate of the transistor MS is connected to the output terminal 8. The source of the transistor MS is connected to the current source 17. The current source 17 outputs a current which is proportional to the control voltage VC.

The buffer circuit 12 is a general buffer amplifier which utilizes a MOS linear circuit. In the buffer circuit 12, the gate of the transistor MS is used as an input. Further, the gate of the transistor MS which is diode-connected is used as an output. If an output signal output from the gate of the transistor MS is vy, then the transfer function $H_3(s)$ of the buffer circuit 12 is expressed by the following equation.

$$H_3(s) = \frac{vy}{vi} = 1 \quad (13)$$

Further, the node N2 of the buffer circuit 12 is connected to the node N1 of the current inverter circuit 11. That is, the buffer circuit 12 performs the operation as an adder circuit which adds an input signal vi with a signal current io of the inverter circuit 11. FIG. 4 is a conceptual diagram of the buffer circuit 12. Assume that the transistors M2, M3, M4, MS have substantially the same ratio of W/L.

A current amplifier circuit 12a is an in-phase amplifier of single configuration. The current amplifier circuit 12a has mutual conductance gm2 (=2/R). The resistance of a variable resistor circuit 12b is "2R". The resistance R used in the buffer circuit 12 corresponds to the resistance R used in the current inverter circuit 11. Therefore, the mutual conductance gm2 and the resistance 2R of the variable resistor circuit 12b are controlled according to the output current Io.

The current amplifier circuit 12a outputs a signal current based on gm2. The signal current of the current amplifier circuit 12a is added to a signal current io of the current inverter circuit 11 at the node N2. The variable resistor circuit 12b corresponds to the transistor MS which is diode-connected. The thus added signal current is current-voltage converted by the variable resistor circuit 12b and becomes an output signal vo.

Next, the transfer function of the APF 1 is explained. The transfer function of the APF 1 is equal to the sum of the transfer function of the buffer circuit 12 and the transfer function of the current inverter circuit 11 containing the capacitor 3. In this case, the input impedance Z of the APF 1 derived based on the input impedance Zi of the current inverter circuit 11 and the capacitance C1 of the capacitor 3 is expressed by the following equation.

$$Z = \frac{sCl + 2k(VC - 2Vt)}{2sClk(VC - 2Vt)} \quad (14)$$

Therefore, if a signal current input to the current inverter circuit 11 via the capacitor 3 is set to "ii", a signal current io output from the current inverter circuit 11 is expressed by the following equation.

$$io = -ii = -\frac{2sClk(VC - 2Vt)}{sCl + 2k(VC - 2Vt)} vi \quad (15)$$

The signal current io is current-voltage converted by supplying the same to the drain of the transistor MS of the buffer circuit 12. At this time, a current which is proportional to the control voltage VC is supplied to the buffer circuit 12 as a bias current from the current source 17. Therefore, the impedance ZM5 of the transistor M5 is expressed by the following equation.

$$ZM5 = \frac{2}{2k(VC - 2Vt)} \quad (16)$$

Thus, signal voltage vHPF attained by converting the signal current io into a voltage form (that is, a signal output from the high-pass filter HPF configured by the capacitor 3 and current inverter circuit 11) is expressed by the following equation.

$$vHPF = io \times ZM5 \quad (17)$$

-continued $$= -\frac{2sClk(VC-2Vt)}{sCl+2k(VC-2Vt)} \times \frac{2}{2k(VC-2Vt)} vi$$

$$= -\frac{2sCl}{sCl+2k(VC-2Vt)} vi$$

The output signal vo is set to a value obtained by adding the input signal vi and signal voltage vHPF together. Therefore, the output signal vo is expressed by the following equation.

$$vo = vi + vHPF = \frac{2k(VC-2Vt) - sCl}{2k(VC-2Vt) + sCl} vi \quad (18)$$

Thus, the transfer function APF(s) of the all-pass filter (APF) 1 is expressed by the following equation.

$$APF(s) = \frac{2k(VC-2Vt) - sCl}{2k(VC-2Vt) + sCl} \quad (19)$$

The equation (19) is equal to an equation obtained by multiplying the equation (2) by −1. In the actual circuit operation, phase rotation is simply made in a direction opposite to that of the case of the equation (2) and the same group delay amount and gain can be attained.

As described above, in the present embodiment, the buffer circuit 12 and the high-pass filter HPF configured by the capacitor 3 and current inverter circuit 11 are provided. The input impedance of the current inverter circuit 11 is varied according to the control voltage VC input to the current inverter circuit 11 to control the time constant determined by the input impedance and the capacitance of the capacitor 3. Further, the current inverter circuit 11 inverts a signal input from the capacitor 3 and outputs the thus inverted signal to the buffer circuit 12. The buffer circuit 12 converts a signal output from the current inverter circuit 11 into a voltage form and adds the thus converted signal voltage to the input signal vi.

Thus, according to the present embodiment, the all-pass filter can be configured by use of the current inverter circuit 11 and the buffer circuit 12 which is operated as an adder circuit.

Further, since the all-pass filter is configured by use of the MOS transistors, the process for compressing or expanding the input signal is not performed. Therefore, the noise characteristic can be enhanced. Further, since it is not required to increase a current in order to enhance the noise characteristic, the power consumption can be reduced.

In addition, since the input/output configuration which responses to voltage is made, it is highly resistant to disturbance. As a result, the layout design can be easily made. Further, since the voltage-current conversion process and current-voltage conversion process can be performed by use of a simple circuit, the circuit scale can be made small and the integration density can be enhanced. At the same time, deterioration in the noise characteristic due to a rise of the integration density can be suppressed. Further, since the APF 1 can be configured by the MOS transistors, the cost can be lowered.

In FIG. 2, the all-pass filter (APF) 1 is configured by the NMOS transistors, but it can be configured by PMOS transistors.

Second Embodiment

In a second embodiment, an APF 20 is configured by setting an output current of a current inverter circuit 21 to twice that of the current inverter circuit 11 and setting the output impedance of a buffer circuit 22 to half that of the buffer circuit 12.

FIG. 5 is a circuit diagram showing the configuration of the APF 20 according to the second embodiment of this invention. An N-type MOS transistor M6 has a ratio of W/L which is twice that of a transistor M1. That is, the drain current of the transistor M6 is twice that of the transistor M1. Further, a current source 18 supplies a current which is twice that of a current source 13. Therefore, a signal current io' output from the current inverter circuit 21 becomes twice the signal current io output from the current inverter circuit 11. The signal current io' is expressed by the following equation.

$$io' = 2io = -\frac{2 \times 2sClk(VC-2Vt)}{sCl+2k(VC-2Vt)} vi \quad (20)$$

Further, MOS transistors M7, M8 have a ratio of W/L which is twice that of a transistor MS (or a MOS transistor M4). Therefore, the impedance ZM8 of the transistor M8 becomes half the impedance ZM5 of the transistor M5. Thus, the impedance ZM8 of the transistor M8 is expressed by the following equation.

$$ZM8 = \frac{1}{2}ZM5 = \frac{2}{2k(VC-2Vt)} \times \frac{1}{2} \quad (21)$$

The same relation as that of the equation (17) can be attained based on relations of the equations (20) and (21). Therefore, the transfer function of the APF 20 becomes equal to that of the equation (19).

Thus, according to the present embodiment, the same transfer function as that of the APF 1 explained in the first embodiment can be attained even when the W/L ratio of the transistor is changed.

The W/L ratio of the second embodiment is shown as one example. The W/L ratios of the transistor M6 and the transistors M7, M8 can be changed in a range in which signal voltage vHPF is kept unchanged. That is, the transistor M6 may have a W/L ratio which is an integral multiple of the W/L ratio of the transistor M1 and the transistors M7, M8 may have W/L ratios which are the integral multiple of the W/L ratios of the transistors M4, M5.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An all-pass filter circuit comprising:
   a first terminal to which an input signal is input;
   a second terminal from which an output signal is output;
   a capacitor having a first electrode connected to the input terminal and a second electrode;
   a current amplifier circuit having a first input terminal to which a first signal output from the capacitor is input, a first output terminal and a control terminal to which a control signal for controlling conductance of the current amplifier circuit, the current amplifier circuit generating a second signal based on the conductance, the second signal being output from the first output terminal; and an adder circuit having a second input terminal to which the input signal is input and a second output terminal, and adding the second signal and the input signal together to output the output signal from the second output terminal, the adder circuit including a first MOS transistor having a first drain, a first gate and a first source, the first gate being connected to the first terminal, and a second MOS transistor having a second drain to which the input signal is input, a second gate and a second source, the second drain and the second gate being connected together, the second source being connected to the first source, and the second gate outputting the output signal.

2. The all-pass filter circuit according to claim 1, wherein the current amplifier circuit includes a resistor circuit connected between a ground potential node and the first input terminal and having resistance which varies according to the control signal.

3. The all-pass filter circuit according to claim 2, wherein the current amplifier circuit comprises a current inverter circuit.

4. The all-pass filter circuit according to claim 3, wherein the current inverter circuit inverts the first signal to output the second signal.

5. The all-pass filter circuit according to claim 4, wherein the current inverter circuit has input impedance corresponding to the resistance of the resistor circuit.

6. The all-pass filter circuit according to claim 5, wherein the current inverter circuit includes a third MOS transistor having a third drain, a third gate and a third source, the third drain and the third gate being connected together, the third source being grounded, and the third drain being connected to the second electrode of the capacitor, a fourth MOS transistor having a fourth drain, a fourth gate and a fourth source, the fourth drain outputting the second signal the fourth gate being connected to the third gate, and the fourth source being grounded, a third current source configured by a current mirror circuit and supplying a drain current to the third and fourth MOS transistors, and a fifth MOS transistor serially connected between the third MOS transistor and the third current source, having a fifth gate to which the control signal is input and controlling the input impedance.

7. The all-pass filter circuit according to claim 5, wherein the capacitor and the current inverter circuit configure a high-pass filter.

8. The all-pass filter circuit according to claim 1, wherein the adder circuit comprises a buffer circuit.

9. The all-pass filter circuit according to claim 1, wherein the second MOS transister converts the second signal into a voltage signal.

10. The all-pass filter circuit according to claim 4, wherein the current inverter circuit multiplies the first signal by m (m is a desired number) and the adder circuit multiplies the second signal by 1/m.

11. The all-pass filter circuit according to claim 1, wherein W/L ratios of the first and second MOS transistors are substantially the same.

12. The all-pass filter circuit according to claim 6, wherein W/L ratios of the third and fourth MOS transistors are substantially the same.

13. The all-pass filter circuit according to claim 1, wherein the input signal and the output signal are voltage signals.

14. The all-pass filter circuit according to claim 1, wherein the adder circuit includes a first current source configured by a current mirror circuit and supplying a drain current to the first and second MOS transistors, and a second current source connected between the first source and a ground potential node.

15. The all-pass filter circuit according to claim 14, wherein the second current source supplies a current which is proportional to the control signal.

16. The all-pass filter circuit according to claim 1, wherein the second MOS transistor functions as a resistance.

* * * * *